(12) United States Patent
Chang

(10) Patent No.: US 6,294,466 B1
(45) Date of Patent: Sep. 25, 2001

(54) HDP-CVD APPARATUS AND PROCESS FOR DEPOSITING TITANIUM FILMS FOR SEMICONDUCTOR DEVICES

(75) Inventor: Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/071,514

(22) Filed: May 1, 1998

(51) Int. Cl.$^7$ .................. H01L 21/44; H01L 21/4763; H05H 1/24
(52) U.S. Cl. .................. 438/680; 438/648; 438/656; 438/676; 438/685; 427/569; 427/576
(58) Field of Search .................. 438/676, 674, 438/680, 685, 656, 648; 427/576, 569, 570

(56) References Cited

U.S. PATENT DOCUMENTS

| | | | |
|---|---|---|---|
| 4,897,709 | * 1/1990 | Yokoyama et al. | 357/68 |
| 4,935,661 | 6/1990 | Heinecke et al. | 313/231.31 |
| 4,970,435 | 11/1990 | Tanaka et al. | 315/111.21 |
| 5,173,327 | 12/1992 | Sandhu et al. | 427/573 |
| 5,326,404 | * 7/1994 | Sato | 118/723 |
| 5,389,154 | 2/1995 | Hiroshi et al. | 118/723 |
| 5,429,070 | 7/1995 | Campbell et al. | 118/723 R |
| 5,503,676 | 4/1996 | Shufflebotham et al. | 118/723 |
| 5,508,066 | 4/1996 | Akahori | 427/571 |
| 5,567,243 | * 10/1996 | Foster et al. | 118/730 |
| 5,595,606 | 1/1997 | Fujikawa et al. | 118/725 |
| 5,648,175 | 7/1997 | Russell et al. | 428/472.3 |
| 5,834,371 | * 10/1998 | Ameen et al. | 438/656 |

FOREIGN PATENT DOCUMENTS

| | | | |
|---|---|---|---|
| 0 536 664 A1 | 4/1993 | (EP) | C23C/16/50 |
| 53-54181 | 5/1978 | (JP) | C23C/11/00 |
| 2025568A | 1/1990 | (JP) . | |

* cited by examiner

Primary Examiner—Charles Bowers
Assistant Examiner—Thanhha Pham
(74) Attorney, Agent, or Firm—Townsend and Townsend and Crew, LLP

(57) ABSTRACT

A method and apparatus for depositing a titanium containing layer on a semiconductor substrate employing high density plasma processing techniques. The titanium source includes a TiCl$_4$ gas which is flowed into a process chamber along with an inert gas source, such as argon and a flow of hydrogen gas. A plasma is present in the process chamber where the semiconductor substrate is situated. The apparatus includes a dome-shaped cover which forms part of the process chamber. The cover includes aperture centrally disposed therein and is adapted to produce a flow of TiCl$_4$ gas that is directed substantially transverse to the semiconductor substrate, with a portion of the flow of hydrogen gas and the inert gas source positioned between the cover and the flow of TiCl$_4$ gas.

16 Claims, 6 Drawing Sheets

HDP-CVD APPARATUS AND PROCESS FOR DEPOSITING TITANIUM FILMS FOR SEMICONDUCTOR DEVICES

BACKGROUND OF THE INVENTION

The present invention relates to the fabrication of integrated circuits. More particularly, the present invention is directed toward a method and apparatus for depositing titanium films on a semiconductor substrate.

Titanium containing films have many desirable characteristics for use in semiconductor processes. For example, titanium can function as a diffusion barrier between adjacent layers of differing material and prevent migration of one atomic species, or titanium containing films may serve to improve the adhesion between such layers. Titanium containing films may also be used to construct ohmic contacts by forming an alloy with semiconductor material.

Physical Vapor Deposition (PVD) systems were early employed to deposit titanium containing films on substrates. In an exemplary PVD system, a target consisting of a plate of titanium is connected to a negative DC voltage or radio frequency (RF) generator. A substrate holder facing the target is either grounded, floating, biased, heated, cooled, or some combination thereof. A gas, such as argon, is introduced into the PVD system, typically maintained at a pressure between a few millitorr (mtorr) and about 100 mtorr, to provide a medium in which a glow discharge can be initiated and maintained. When the glow discharge is started, positive ions strike the target, and titanium atoms are removed by momentum transfer. These titanium atoms subsequently condense into a thin titanium containing film on the substrate. However, the present dimensions of semiconductor devices has limited the usefulness of PVD. Many of these semiconductor devices have aspect ratios which frustrate deposition of uniform conformal layers due to shadowing effects.

Another technique to deposit titanium containing films on a substrate employed a conventional chemical vapor deposition (CVD) system. In an exemplary CVD system, reactive gases and diluent inert gases are flowed into a reaction chamber and gas species reactants are adsorbed on a silicon wafer substrate. Loosely bonded atoms migrate across the substrate and cause film-forming chemical reactions. The gaseous by-products of the reaction are then desorbed and removed from the reaction chamber. The chemical reactions that lead to formation of a solid material, such as a titanium containing film, may be either heterogenous, i.e., on the wafer surface, or homogeneous, i.e., in the gas phase. CVD systems include either hot wall reactors, i.e., reactors reaching temperatures of 600° C. and greater, or cold wall reactor, reactors reaching temperatures less than 600° C. Although hot wall reactors produce higher quality films, deposition on the walls often occurs which reduces the deposition rate, compared to the deposition rate of cold wall reactors for a given flow of process gases.

Increased deposition rates with suitable film quality has been achieved employing a plasma-enhanced chemical vapor deposition (PECVD) system. As is well known, a plasma, which is a mixture of ions and gas molecules, may be formed by applying energy, such as radio frequency (RF) energy, to a process gas in the deposition chamber under the appropriate process conditions, e.g., chamber pressure, temperature, RF power, and others. The plasma reaches a threshold density to form a self-sustaining condition, known as forming a glow discharge (often referred to as "striking" or "igniting" the plasma). This RF energy raises the energy state of molecules in the process gas and forms ionic species from the molecules. Both the energized molecules and ionic species are typically more reactive than the process gas, and hence more likely to form the desired film. Advantageously, the plasma also enhances the generation of reactive species in the gas phase to be deposited on the surface of the substrate allowing the formation of a better quality film at lower temperatures.

U.S. Pat. No. 5,173,327 to Sandhu et al. discloses a PECVD system in which the vapor of a heated liquid titanium source enters a modified, plasma enhanced, cold wall reaction chamber and is mixed with hydrogen as it reaches a wafer substrate surface. As the gas vapors reach the heated wafer substrate a chemical reaction of $TiCl_4+2H_2 \rightarrow Ti+4HCl$ occurs, thereby depositing a uniform titanium film upon the substrate surface. A drawback with prior art PECVD systems is that the same, if employing aluminum heaters, are subject to premature failure due to corrosion of the aluminum components contained therein.

In addition to corrosion of aluminum components, unwanted metal deposition is experienced with PECVD systems employed to deposit titanium containing films. Although the greatest film deposition generally occurs in places where the temperature is the highest, some deposition occurs at lower temperatures, resulting in unwanted deposition. Unwanted deposition can cause multiple problems, such as uneven deposition, arcing, degraded operation of chamber components, and/or device defects. Unwanted deposition may occur on non-conductive components, such as ceramic spacers and liners within the deposition chamber or chamber exhaust path, which then become conductive. This undesired conductive deposition can disrupt the shape of the glow discharge, resulting in uneven deposition across the substrate. It can also cause arcing, which may damage the substrate and parts of the chamber, such as the faceplate.

Further, titanium may build up on parts of the heater, in gas or vacuum apertures to undesirably restrict the flow therethrough, or on mechanical parts having close tolerances to interfere with their operation. Unwanted deposits that have bonded poorly to the underlying chamber component or that have built up on the heater may result in flakes and other particles that fall onto the substrate and cause defects, thus reducing substrate yield.

U.S. Pat. No. 5,508,066 to Akahori discloses a LPCVD system that reduces the aforementioned problems. Specifically, as disclosed therein, a plasma generation chamber is disposed adjacent to a reaction chamber. The plasma generation chamber is separated from the reaction chamber by a diaphragm which includes a centrally located plasma extraction window. A flow of gas is introduced into the reaction chamber that includes $TiCl_4$ gas. A flow of argon and hydrogen gases is introduced into the plasma chamber. In this fashion, titanium residue in the plasma generation chamber is reduced. The process conditions of the system are then maintained at suitable parameters to form, upon a substrate disposed in the reaction chamber, a titanium containing film. However, the bifurcated processing chambers of the ECR system makes the system relatively expensive, as compared to PECVD systems, resulting in increased production costs of semiconductor devices manufactured therewith.

What is needed is a method and an apparatus for depositing a titanium containing film employing a single process chamber semiconductor processing system having deposition rates comparable with existing PECVD systems while avoiding unwanted deposition within the process chamber.

SUMMARY OF THE INVENTION

The present invention provides a method and an apparatus for depositing a titanium containing film employing a single process chamber semiconductor processing system having deposition rates comparable with existing PECVD systems while avoiding unwanted deposition within the process chamber. The invention does so by employing an HDP-CVD deposition system and flowing a deposition gas into the process chamber thereof which includes a bifurcated flow of a titanium source gas and a plasma forming gas. The titanium source gas and the plasma forming gas are flowed into the process chamber concurrently through an aperture in a lid covering the process chamber so that the flow of the plasma forming gas is positioned between the flow of titanium gas and the walls of the lid and process chamber. In this fashion, unwanted deposition of a titanium containing film on various surfaces the process chamber is reduced.

The titanium containing film is deposited employing a high-density plasma-chemical vapor deposition (HDP-CVD) system, such as an Applied Materials, Inc. Ultima HDP-CVD System. Typically, gaps having a high-aspect-ratio of up to 6:1 may be present on a substrate upon which the titanium-containing film is to be deposited, with the substrate being positioned in a process chamber of the HDP-CVD system. A deposition gas, such as a titanium gas source gas, and a plasma forming gas are flowed across the surface of the substrate. An RF source generator and an RF bias generator are each in electrical communication with the process chamber to form a plasma therein.

An important consideration when depositing a titanium containing film is to ensure that the surface of the substrate is substantially clean, i.e., any native oxide present thereon is removed. By employing an HDP-CVD system, a clean process may, such as argon sputtering, and/or a hydrogen containing plasma, may be effectuated immediately preceding the deposition of the titanium containing film, without having to move the substrate between differing process chambers. This decreases the time required for processing the substrate.

In a preferred embodiment a pure titanium film is deposited on the substrate. The titanium source gas is titanium tetrachloride, $TiCl_4$, and the plasma forming gas comprises of hydrogen, $H_2$, and may or may not include a flow of an inert carrier gas, such as argon, Ar. The RF source generator operates at a source frequency of about 2 MHz and a source power level of between about 0.20–1.85 $W/cm^2$. The RF bias generator operates at a frequency of about 13.56 MHz and a power level of between about 0.20–1.85 $W/cm^2$. The process chamber pressure may be between about 2 and 20 millitorr, with 4–5 millitorr being the preferred pressure range. To deposit the titanium containing film, the titanium tetrachloride and the plasma forming gas are flowed into the process chamber. Specifically, titanium tetrachloride is flowed into the process chamber at a flow rate in the range of 2 to 72 standard cubic centimeters per minute (sccm), hydrogen gas is flowed into the process chamber at a flow rate in the range of 200 to 2,000 sccm, and argon, Ar, is flowed in at a rate of 100 to 2,000 sccm. The process conditions are maintained at suitable conditions to deposit a titanium containing film.

For a further understanding of the objects and advantages of the present invention, reference should be made to the ensuing detailed description taken in conjunction with the accompanying drawings.

DETAILED DESCRIPTION OF THE PREFERRED EMBODIMENTS

I. Introduction

In one embodiment, a titanium containing film formed from a titanium tetrachloride gas is deposited on a stepped substrate employing a standard HDP-CVD system. Unwanted deposition of the titanium containing film within the process chamber is reduced by flowing a plasma forming gas into the process chamber, concurrently with the titanium tetrachloride gas. The titanium tetrachloride gas and the plasma forming gas are flowed into the process chamber through an aperture in a lid covering the process chamber so that the flow of the plasma forming gas is positioned between the flow of titanium tetrachloride gas and the walls of the lid and process chamber. In this fashion, unwanted deposition of a titanium containing film on surfaces within the process chamber is reduced.

II. An Exemplary CVD System

Figure 1:
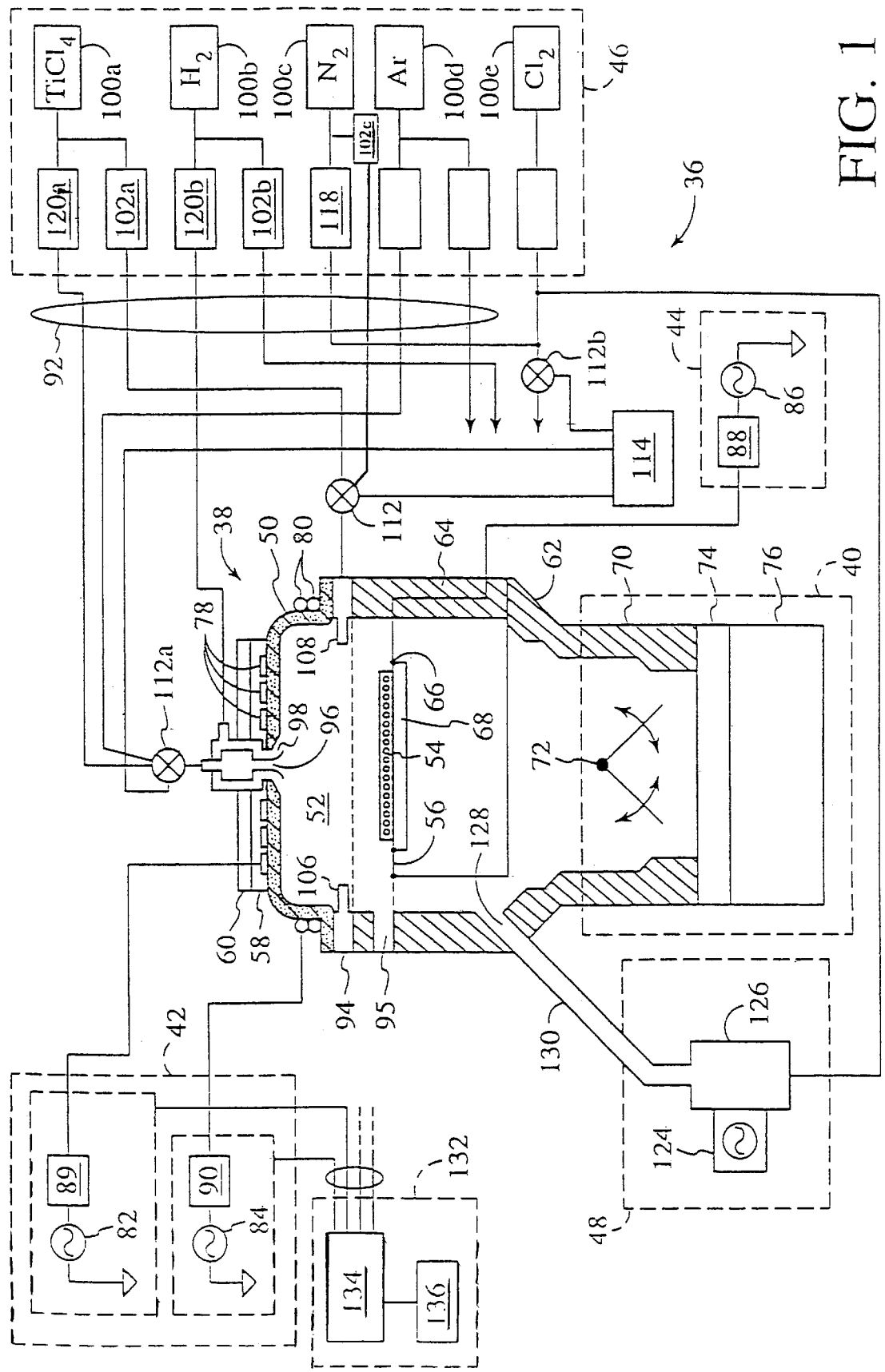
FIG. 1 is a simplified diagram of one embodiment of a HDP-CVD system according to the present invention.

FIG. 1 illustrates one embodiment of a HDP-CVD system 36, in which a titanium containing film according to the present invention can be deposited. The system 36 includes a process chamber 38, a vacuum system 40, a source plasma system 42, a bias plasma system 44, a gas delivery system 46, and a remote plasma cleaning system 48.

An upper portion of process chamber 38 includes a cover, referred to as a dome 50, which is made of a dielectric material, such as alumina or aluminum nitride. The dome 50 defines an upper boundary of a plasma processing region 52. The plasma processing region 52 is bounded on the bottom by the upper surface of substrate 54 and the substrate support member 56.

A heater plate 58 and a cold plate 60 surmount, and are thermally coupled to, the dome 50. The heater plate 58 and the cold plate 60 allow control of the dome temperature to within about ±10° C. over a range of about 100° C. to 200° C. This allows optimizing the dome temperature for various processes. For example, it may be desirable to maintain the dome 50 at a higher temperature for cleaning or etching processes than for deposition processes. Accurate control of the dome temperature also reduces the flake or particle counts in the process chamber and improves adhesion between the deposited layer and the substrate.

The lower portion of process clamber 38 includes a body member 62 which joins the process chamber to the vacuum system. A base portion 64 of the substrate support member 56 is mounted on, and forms a continuous inner surface with, body member 62. Substrates are transferred into and out of process chamber 38 by a robot blade (not shown) through an insertion/removal opening 95 in the side of process chamber 38. A motor (not shown) raises and lowers a lift-pin plate (not shown) that raises and lowers lift pins (not shown) that raise and lower the wafer. Upon transfer into process chamber 38, substrates are loaded onto the raised lift pins, and then lowered to a substrate receiving portion 66 of substrate support member 56. Substrate receiving portion 66 includes an electrostatic chuck 68 that secures the substrate to the substrate support member 56 during substrate processing.

The vacuum system 40 includes a throttle body 70 which houses twin-blade throttle valve 72, attached to gate valve 74, and a turbo molecular pump 76. It should be noted that throttle body 70 offers minimum obstruction to gas flow, and allows symmetric pumping, as described in co-pending, co-assigned U.S. Patent Application, originally filed on filed Dec. 12, 1995, and assigned Ser. No. 08/574,839, refiled on Sep. 11, 1996 and assigned Ser. No. 08/712724 entitled "SYMMETRIC CHAMBER". The gate valve 74 can isolate the pump 76 from the throttle body 70, and can also control process chamber pressure by restricting the exhaust flow capacity when throttle valve 72 is fully open. The arrangement of the throttle valve 72, gate valve 74, and turbo molecular pump 76 allow accurate and stable control of process chamber pressures from about 1 to 100 millitorr.

The source plasma system 42 includes a top coil 78 and side coil 80, mounted on dome 50. A symmetrical ground shield (not shown) reduces electrical coupling between the coils. Top coil 78 is powered by top RF source generator 82, while the side coil 80 is powered by side RF source generator 84, allowing independent power levels and frequencies of operation for each coil. This dual coil system allows control of the radial ion density in process chamber 38, thereby improving plasma uniformity. Side coil 80 and top coil 78 couple energy into the chamber 38 inductively. In a specific embodiment, the top RF source generator 82 provides up to 50–600 W of RF power at nominally 2 MHz and the side RF source generator 84 provides up to 50–600 W of RF power at nominally 2 MHz. The operating frequencies of the top and side RF generators may be offset from the nominal operating frequency (e.g., to 1.7–1.9 MHz and 1.9–2.1 MHz, respectively) to improve plasma-generation efficiency.

The RF generators 82 and 84 include digitally controlled synthesizers and operate over a frequency range from about 1.7 to about 2.1 MHz. Each generator includes an RF control circuit (not shown) that measures reflected power from the process chamber and coil back to the generator, and adjusts the frequency of operation to obtain the lowest reflected power, as understood by a person of ordinary skill in the art. RF generators are typically designed to operate into a load with a characteristic impedance of 50-Ω. RF power may be reflected from loads that have a different characteristic impedance than the generator. This can reduce power transferred to the load. Additionally, power reflected from the load back to the generator may overload and damage the generator. Because, the impedance of a plasma may range from less than 5-Ω to over 900-Ω, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 89 and 90 match the output impedance of generators 82 and 84 with coils 78 and 80, respectively. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

The bias plasma system 44 includes a RF bias generator 86 and a bias matching network 88. The bias plasma system 44 capacitively couples substrate receiving portion 66 to the body member 62, which act as complementary electrodes. The bias plasma system 44 serves to enhance the transport of plasma species created by the source plasma system 42 to the surface of the substrate. In a specific embodiment, the RF bias generator 86 provides up to 5000 W of RF power at 13.56 MHz.

Other measures may also help stabilize a plasma. For example, the RF control circuit can be used to determine the power delivered to the load (plasma) and may increase or decrease the generator output power to keep the delivered power substantially constant during deposition of a layer.

The gas delivery system 46 includes a plurality of gas sources 100a, 100b, 100c, 100d and 100e, such as titanium tetrachloride, $TiCl_4$, hydrogen, $H_2$, nitrogen, $N_2$, argon, Ar, and chlorine, $Cl_2$, respectively. The gas delivery system 46 provides these gases to the process chamber for processing the substrate via gas delivery lines 92 (only some of which are shown). Gases are introduced into the process chamber 38 through a gas ring 94, a top nozzle 96, and a top vent 98. Specifically, gas source, 100a provides gas to top nozzle 96 via flow controller 120a and gas delivery lines 92. Gas from gas sources 100b and 100d are provided to gas vent 98 via flow controllers 120b and 120c, respectively. The top nozzle 96 and top vent 98 allow independent control of top and side flows of the gases, which improves film uniformity and allows fine adjustment of the film's deposition and doping parameters. The top vent 98 is an annular opening around the top nozzle 96 through which gas may flow into the process chamber from the gas delivery system.

Gas is provided from each of the aforementioned gas sources to gas ring 94 via flow controller 102a, 102b, 102c, 102d and 102e and gas delivery lines 92. Gas ring 94 has a plurality of gas nozzles 106 and 108 (only two of which is shown) that provide a uniform flow of gas over the substrate. Nozzle length and nozzle angle may be changed by changing gas ring 94. This allows tailoring the uniformity profile and gas utilization efficiency for a particular process within an individual process chamber. In a specific embodiment, the gas ring 94 has a total of twenty-four gas nozzles, twelve first gas nozzles 108 and twelve second gas nozzles 106. Typically, gas nozzles 108 (only one of which is shown), are coplanar with, and shorter than, the second gas nozzles 106.

In some embodiments, flammable, toxic, or corrosive gases may be used, such as titanium tetrachloride and chlorine. In these instances, it may be desirable to eliminate gas remaining in the gas delivery lines after deposition. This may be accomplished using a three-way valve, such as valve 112, to isolate process chamber 38 from a delivery line, and to vent the delivery line to vacuum foreline 114, for example. As shown in FIG. 1, other similar valves, such as 112a and 112b, may be incorporated on other gas delivery lines. Such three-way valves may be placed as close to process chamber 38 as practical, to minimize the volume of the unvented gas delivery line (between the three-way valve and the process chamber). Additionally, two-way (on-off) valves (not shown) may be placed between a mass flow controller (MFC) and the process chamber or between a gas source and an MFC.

The remote microwave-generated plasma cleaning system 48 is provided to periodically clean deposition residues from process chamber components. The cleaning system includes a remote microwave generator 124 that creates a plasma from a cleaning gas source 100e, such as chlorine, in reactor cavity 126. The reactive species resulting from this plasma are conveyed to process chamber 38 through cleaning gas feed port 128 via applicator tube 130. The materials used to contain the cleaning plasma (e.g., cavity 126 and applicator tube 130) should be resistant to attack by the plasma. The distance between reactor cavity 126 and feed port 128 should be kept as short as practical, as the concentration of desirable plasma species may decline with distance from reactor cavity 126. Generating the cleaning plasma in a remote cavity allows the use of an efficient microwave generator and does not subject process chamber components to the temperature, radiation, or bombardment of the glow discharge that may be present in an in situ plasma. Consequently, relatively sensitive components, such as the electrostatic chuck 68, do not need to be covered, with a dummy wafer or otherwise protected, as may be required with an in situ plasma cleaning process. During the cleaning process, or other processes, the gate valve 74 may be closed to isolate the turbo molecular vacuum pump 76 from the process chamber. In this configuration, the foreline 114 provides a process vacuum generated by remote vacuum pumps, which are typically mechanical vacuum pumps. Isolating the turbo molecular pump from the process chamber with the gate valve protects the turbo molecular pump from corrosive compounds or other potentially harmful effects resulting from the process chamber clean or other processes.

A system controller 132 regulates the operation of system 36 and includes a processor 134 in electrical communication therewith to regulate the operations thereof. Typically, the processor 134 is part of a single-board computer (SBC), that includes analog and digital input/output boards, interface boards and stepper motor controller boards. Various components of the CVD system 36 conform to the Versa Modular European (VME) standard which defines board, card cage, as well as connector type and dimensions. The VME standard also defines the bus structure as having a 16-bit data bus and a 24-bit address bus. The processor 134 executes system control software, which is a computer program stored in a memory 136, electronically coupled to the processor 134. Any type of memory device may be employed, such as a hard disk drive, a floppy disk drive, a card rack or a combination thereof. The system control software includes sets of instructions that dictate the timing, mixture of gases, process chamber pressure, process chamber temperature, microwave power levels, pedestal position, and other parameters of a particular process, discussed more fully below with respect to FIG. 3.

Figure 2:
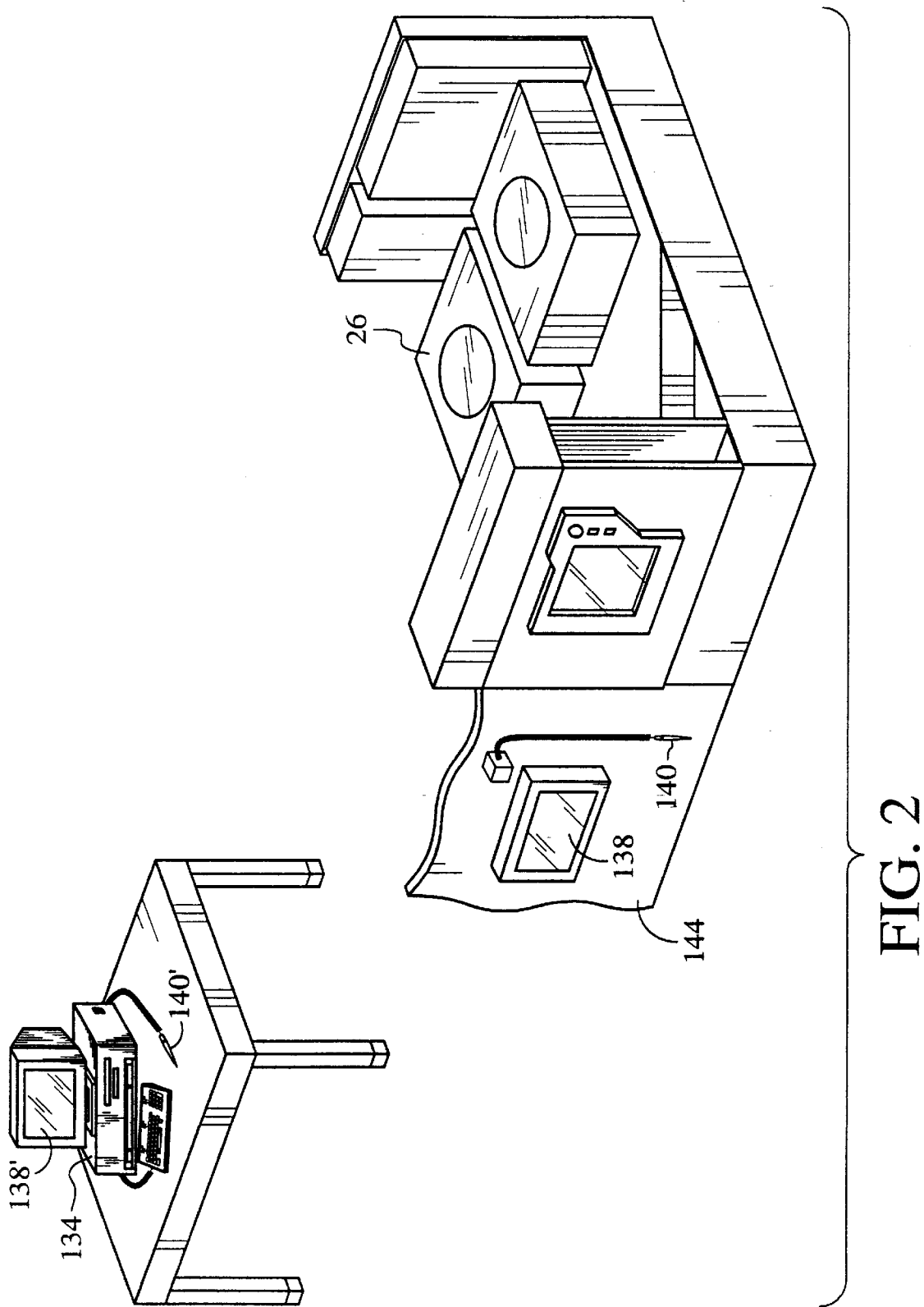
FIG. 2 is a simplified diagram of a monitor and light pen that may be used in conjunction with the exemplary CVD process chamber of FIG. 1.

Referring to FIG. 2, the interface between a user and the processor 134 is via a CRT monitor 138 and light pen 140. In the preferred embodiment two monitors 138 and 138' are used, each having a light pen associated therewith, 140 and 140', respectively. One of the monitors 138 is mounted in a clean room wall 144 for the operators and the other behind the wall for the service technicians. The CRT monitors 138 and 138' may simultaneously display the same information, but only one of the light pens 140 and 140' is enabled for data input during any given time. Were light pen 140 employed to communicate with the processor 134, an operator would place the same on the screen of the CRT monitor 138. A light sensor (not shown) located at the tip of the light pen 140 detects light emitted by the CRT monitor 138. To select a particular screen or function, the operator touches a designated area of the CRT monitor 138 and pushes a button (not shown) on the light pen 140. The touched area provides a visual response, such as a change in color, or a new menu or screen being displayed, confirming communication between the light pen 140 and the CRT monitor 138. Other input devices, such as a keyboard, mouse, or other pointing or communication device, may be used instead of or in addition to the light pen 140 to allow the user to communicate with the processor 134.

The process for depositing the film can be implemented using a computer program product that is executed by the processor 134. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as the memory 136, shown in FIG. 1. If the entered code text is in a high level language, the code is compiled, and the resultant compiler code is then linked with an object code of precompiled Windows™ library routines. To execute the linked, compiled object code the system user invokes the object code, causing the processor 134 to load the code in the memory 136. The processor 134 then reads and executes the code to perform the tasks identified in the program.

Figure 3:
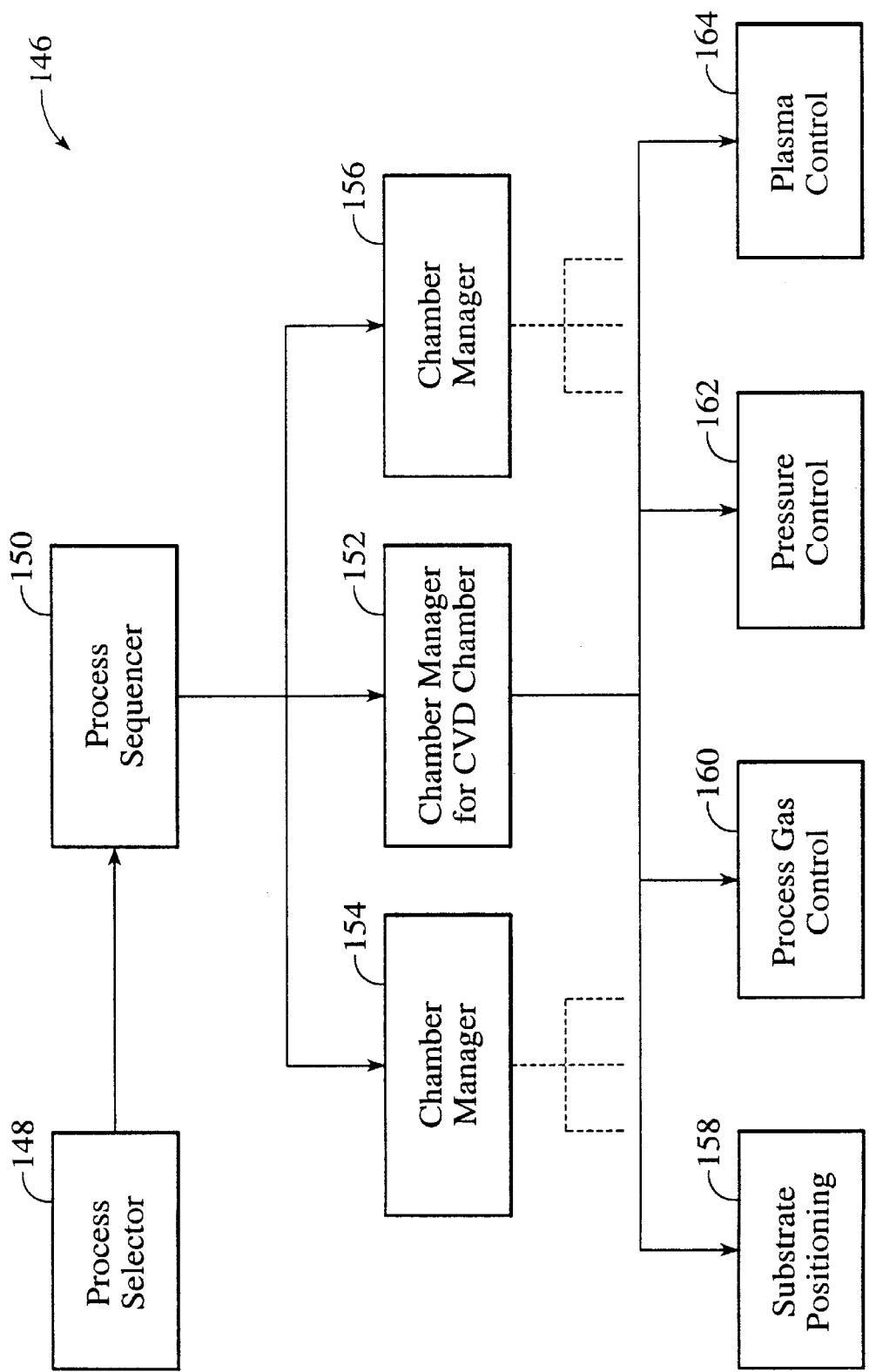
FIG. 3 is a flow chart of an exemplary process control computer program used to control the exemplary CVD process chamber of FIG. 1.

FIG. 3 shows an illustrative block diagram of the hierarchical control structure of system control software 146. A user enters a process set number and process chamber number into a process selector subroutine 148 in response to menus or screens displayed on the CRT monitor by using the light pen interface. The process sets are predetermined sets of process parameters necessary to carry out specified processes, and are identified by predefined set numbers. Process selector subroutine 148 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and process chamber dome temperature, and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of system controller.

A process sequencer subroutine 150 comprises program code for accepting the identified process chamber and set of process parameters from the process selector subroutine 148, and for controlling operation of the various process chambers. Multiple users can enter process set numbers and process chamber numbers, or a user can enter multiple process set numbers and process chamber numbers, so sequencer subroutine 150 operates to schedule the selected processes in the desired sequence. Preferably, sequencer subroutine 150 includes a program code to perform the steps of (i) monitoring the operation of the process chambers to determine if the process chambers are being used, (ii) determining what processes are being carried out in the process chambers being used, and (iii) executing the desired process based on availability of a process chamber and type of process to be carried out. Conventional methods of monitoring the process chambers can be used, such as polling. When scheduling which process is to be executed, sequencer subroutine 150 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 150 determines which process chamber and process set combination is going to be executed next, sequencer subroutine 150 causes execution of the process set by passing the particular process set parameters to process chamber manager subroutines 152, 154 and 156, which controls multiple processing tasks in process chamber 13 and possibly other process chambers (not shown) according to the process set determined by sequencer subroutine 150.

Examples of process chamber component subroutines are substrate positioning subroutine 158, process gas control subroutine 160, pressure control subroutine 162, and plasma control subroutine 164. Those having ordinary skill in the art will recognize that other process chamber control subroutines can be included depending on what processes are desired to be performed in process chamber 13. In operation, process chamber manager subroutine 152 selectively schedules or calls the process component subroutines in accordance with the particular process set being executed. Scheduling by process chamber manager subroutine 152 is performed in a manner similar to that used by sequencer subroutine 150 in scheduling which process chamber and process set to execute. Typically, process chamber manager subroutine 152 includes steps of monitoring the various process chamber components, determining which components need to be operated based on the process parameters for the process set to be executed, and causing execution of a process chamber component subroutine responsive to the monitoring and determining steps.

Figure 4:
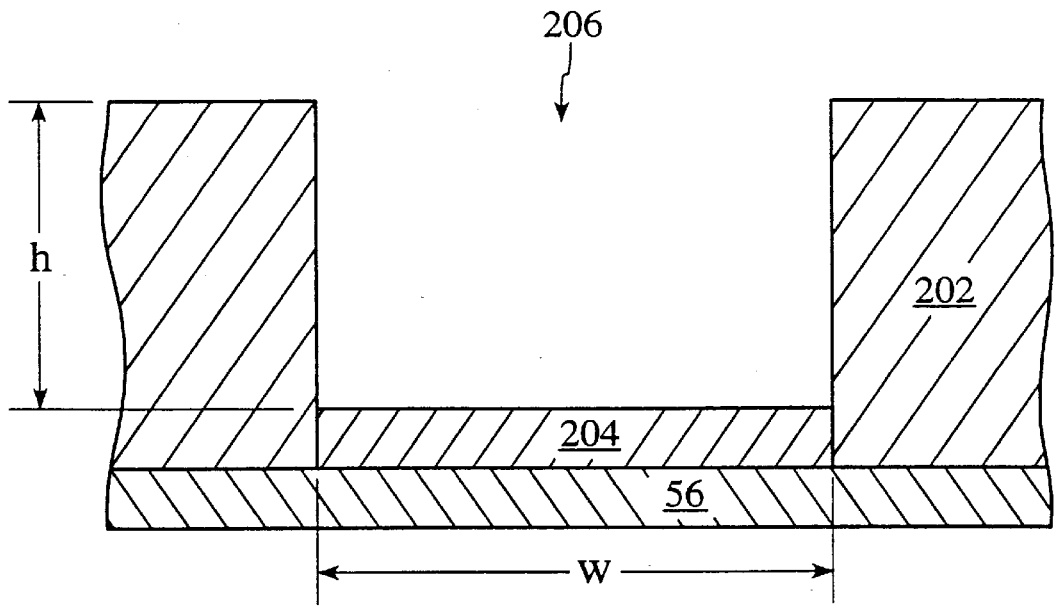
FIG. 4 is a cross-sectional view of a substrate employed in the present invention.

Referring to both FIGS. 1 and 4, in operation the substrate positioning subroutine 158 comprises program code for controlling process chamber components that are used to load the substrate 54 onto substrate support number 68. The substrate positioning subroutine 158 may also control transfer of a substrate into process chamber 38 from, e.g., a plasma-enhanced CVD (PECVD) reactor or other reactor in the multichamber system, after other processing has been completed.

The process gas control subroutine 160 has a program code for controlling process gas composition and flow rates. Subroutine 160 controls the open/close position of the safety shut-off valves, and also ramps up/down the mass flow controllers to obtain the desired gas flow rates. All process chamber component subroutines, including process gas control subroutine 160, are invoked by process chamber manager subroutine 152. Subroutine 160 receives process parameters from process chamber manager subroutine 152 related to the desired gas flow rates.

Typically, process gas control subroutine 160 operates by opening the gas supply lines, and repeatedly (i) reading the necessary mass flow controllers, (ii) comparing the readings to the desired flow rates received from process chamber manager subroutine 152, and (iii) adjusting the flow rates of the gas supply lines as necessary. Furthermore, process gas control subroutine 160 may include steps for monitoring the gas flow rates for unsafe rates, and activating the safety shut-off valves when an unsafe condition is detected.

In some processes, an inert gas, such as argon, is flowed into process chamber 13 to stabilize the pressure in the process chamber before reactive process gases are introduced into the process chamber. For these processes, the process gas control subroutine 160 is programmed to include steps for flowing the inert gas into process chamber 13 for an amount of time necessary to stabilize the pressure in the process chamber. The above-described steps may then be carried out.

Additionally, when a process gas is to be vaporized from a liquid precursor, for example, titanium tetrachloride ($TiCl_4$), the process gas control subroutine 160 is written to include steps for injecting the liquid precursor in a liquid vaporizer-feeder, commonly referred to as a precision liquid injection system one of which in described in U.S. Pat. No. 5,272,880, which is incorporated by reference herein.

The process gas control subroutine 160 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 162 includes program code for controlling the pressure in process chamber 38 by regulating the size of the opening of throttle valve 72 in the exhaust portion of the process chamber. There are at least two basic methods of controlling the process chamber with the throttle valve. The first method relies on characterizing the process chamber pressure as it relates to, among other things, the total process gas flow, size of the process chamber, and pumping capacity. The first method sets throttle valve 72 to a fixed position. Setting throttle valve 72 to a fixed position may eventually result in a steady-state pressure.

Alternatively, the process chamber pressure may be measured with a manometer, for example, and throttle valve 72 position may be adjusted according to pressure control subroutine 162, assuming the control point is within the boundaries set by gas flows and exhaust capacity. The former method may result in quicker process chamber pressure changes, as the measurements, comparisons, and calculations associated with the latter method are not invoked. The former method may be desirable where precise control of the process chamber pressure is not required, whereas the latter method may be desirable where an accurate, repeatable, and stable pressure is desired, such as during the deposition of a layer.

When pressure control subroutine 162 is invoked, the desired (or target) pressure level is received as a parameter from process chamber manager subroutine 152. Pressure control subroutine 162 operates to measure the pressure in process chamber 38 by reading one or more conventional pressure manometers connected to the process chamber, compare the measure value(s) with the target pressure, obtain proportional, integral, and differential (PID) values from a stored pressure table corresponding to the target pressure, and adjust throttle valve 72 according to the PID values obtained from the pressure table. Alternatively, pressure control subroutine 162 may open or close throttle valve 72 to a particular opening size to regulate the pressure in process chamber 38 to a desired pressure or pressure range.

The plasma control subroutine 164 comprises program code for controlling the frequency and power output setting of RF generators 82 and 84, and for tuning matching networks 88 and 90. Plasma control subroutine 164, like the previously described process chamber component subroutines, is invoked by process chamber manager subroutine 152.

An example of a system which may incorporate some or all of the subsystems and routines described above would be an Ultima System, manufactured by Applied Materials, configured to practice the present invention.

IV. Deposition of A Titanium Containing Film

Figure 5:
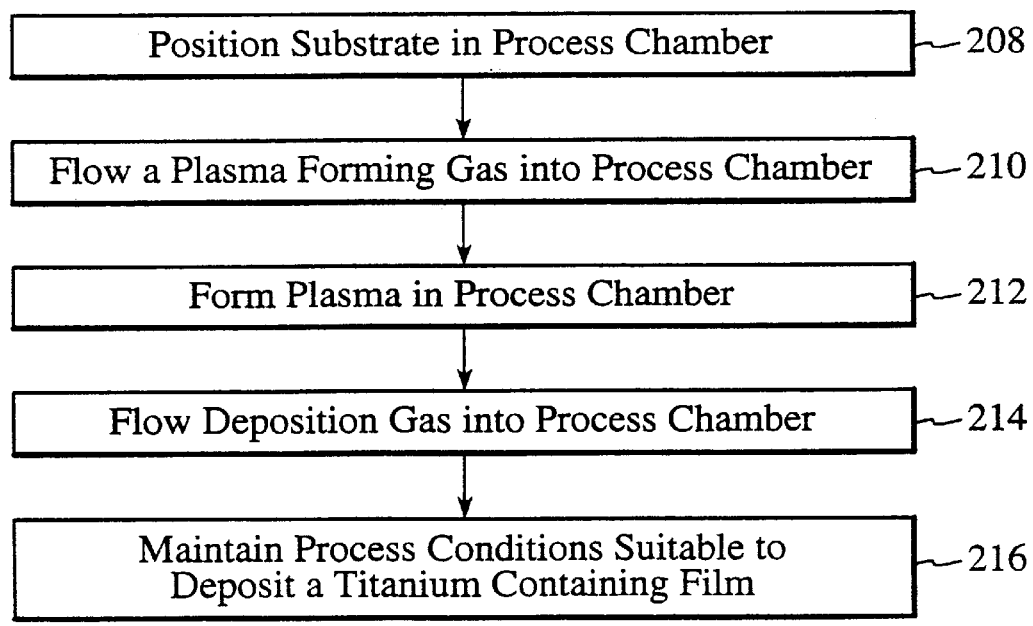
FIG. 5 is a flow diagram of the method in accord with the present invention.

Referring to both FIGS. 1 and 5, the method of the present invention may be employed to metal layers on the substrate 56 positioned in the (HDP-CVD) system 36. Although the substrate may have virtually any topography, the substrate 56 typically has stepped surfaces with one or more film layers disposed thereon, shown as 202, as well as native oxide, shown as 204 resting atop of layer 202. The film layer 202 may be formed from a semiconductor material that has one or more vias 206 formed therein, before deposition of a titanium containing film employing the present invention. The via 206 may have an aspect ratio of up to 6:1 or more, with the aspect ratio being defined as the height of the via 206, h, divided by the via 206's width, w.

Figure 6:
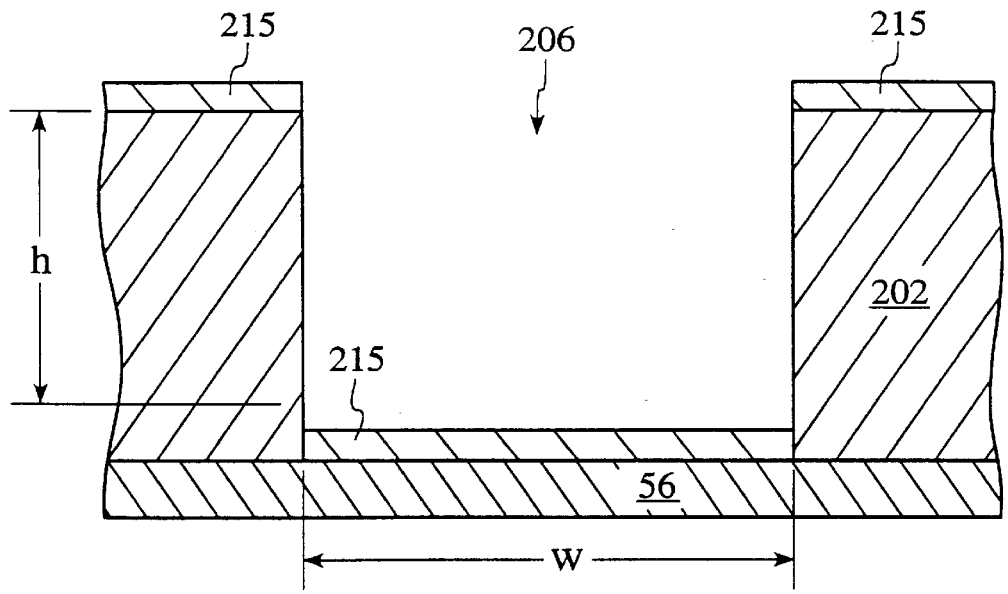
FIG. 6 is a cross-sectional view of the substrate shown in FIG. 4 with a titanium containing film disposed thereon in accord with the present invention.

Referring to both FIGS. 1 and 5, the method includes a step 208 during which the substrate 56 is positioned in the process chamber 38 proximate to the plasma processing region 52. Subsequent to step 208, a plasma forming gas, such as hydrogen, is flowed into the process chamber 38, during step 210, from which a plasma is formed at step 212. The plasma forming gas may or may not include a flow of an inert carrier gas, such as argon. Following step 212, a deposition gas is introduced into the process chamber 38, at step 214. The deposition gas consists of, for example, titanium tetrachloride, $TiCl_4$. During the step 210, and if argon is employed, it is preferred that flow rate of argon is in the range of 100 to 2,000 standard cubic centimeters per minute (sccm), and the flow rate of the hydrogen gas is in the range of 200 to 2,000 sccm. The flow rate of the titanium tetrachloride during step 214 is in the range of 2 to 72 sccm. The aforementioned plasma is formed by the RF source generators 82 and 84 creating an RF field in the plasma processing region 52 having a frequency of about 2 MHz and a power level of between about 0.20–1.85 W/cm$^2$, and the RF bias generator 86 creating an RF field having a frequency of about 13.56 MHz and a power level between about 0.20–1.85 W/cm$^2$. Typically, the pressure of the atmosphere in the process chamber is maintained between about 2 and 20 millitorr, with 4–5 millitorr being the preferred pressure range. During step 214, a film 215 comprising substantially pure titanium is deposited over layer 202 and substrate 56, shown in FIG. 6, with oxide 204 being removed with a cleaning step, discussed more fully below. Film 215 may have any thickness desired, depending upon the application.

This process is advantageous for forming a stable contact due to reduced native oxidation of substrate 56 prior to deposition of the substantially pure titanium film 215. Although the substrate 56 is subjected to a wet clean before deposition of the substantially pure titanium film, typically, a native oxidation may either remain after cleaning or form thereon during storage of the substrate. By employing the HDP-CVD system 36, shown in FIG. 1, process a plasma may be struck in the process chamber 38 and a fluorine source introduced therein to remove any native oxidation present on the substrate. Thereafter, the deposition of the substantially pure titanium film 215, shown in FIG. 6, may be commenced before oxidation can reform on the substrate 56.

Referring again to FIG. 1, a concern with employing plasma techniques to deposit titanium films on a substrate is avoiding unwanted metal deposition on various surfaces within the process chamber. This is particularly problematic is inductive coupled plasma where generation of the plasma is dependent upon Rf energy radiating from coils 78 and 80. Thus, in a typical inductively coupled plasma chamber, titanium tetrachloride entering the process chamber 38 would rapidly deposit on the interior surfaces of the dome 50. This disrupts the stability of the plasma under some conditions and results in uneven deposition, arcing, degraded operation of chamber components, and/or device defects, thus reducing substrate yield.

To avoid the aforementioned problems, the flow of titanium tetrachloride gas and the gases from which the plasma is formed, i.e., the plasma forming gas, is bifurcated into two different flows. Either the plasma forming gas is flowed into the process chamber 38 before the titanium source gas or the plasma forming gas and the titanium gas source are flowed into the process chamber concurrently. Specifically, the MFC 120a is activated to ensure that all of the titanium tetrachloride gas passes into process chamber 38, through top gas nozzle 96. MFC 102b is activated so that hydrogen gas enters through top vent 98. The relative flow rates of the hydrogen gas and the titanium tetrachloride gas are selected so that dome 50 walls are separated from the titanium tetrachloride gas by the flow of hydrogen gas. In one embodiment, the flow of titanium tetrachloride gas is directed in a direction substantially perpendicular to the substrate 256, and the flow of hydrogen gas forms a curtain thereabout.

Figure 7:
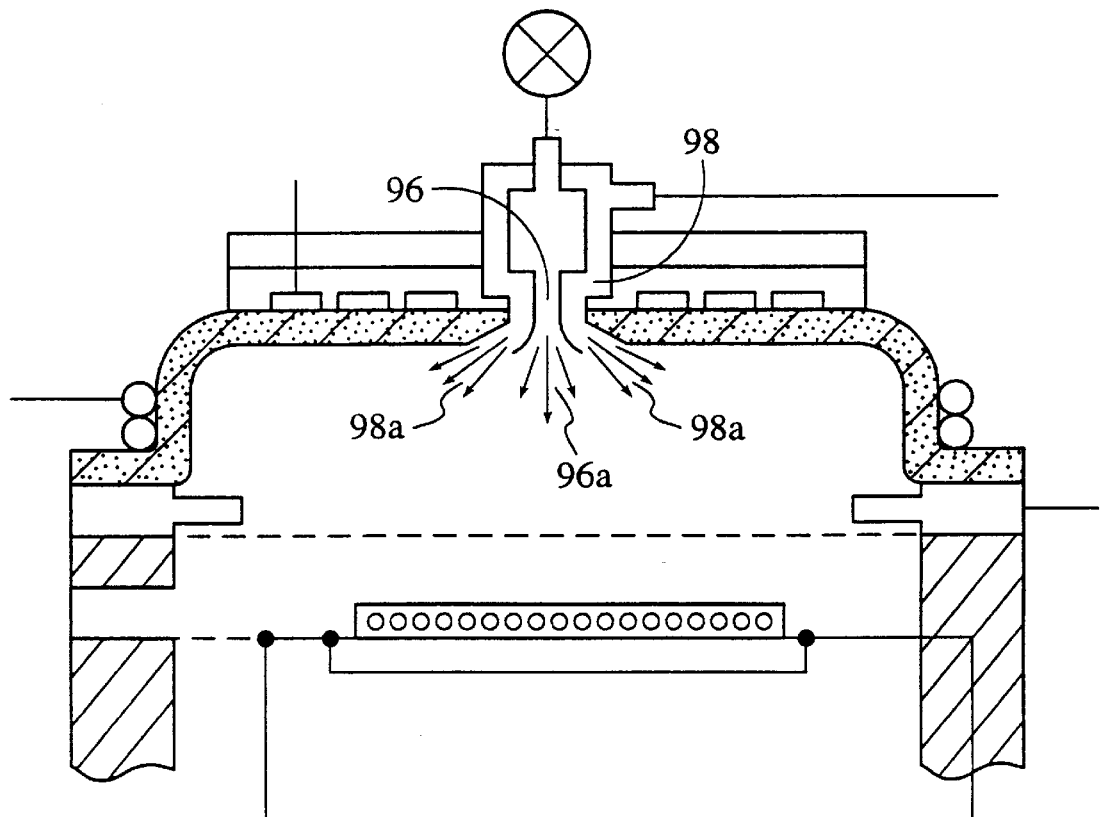
FIG. 7 is a detailed view of the HDP-CVD system shown in FIG. 1, in accord with an alternative embodiment.
Figure 8:
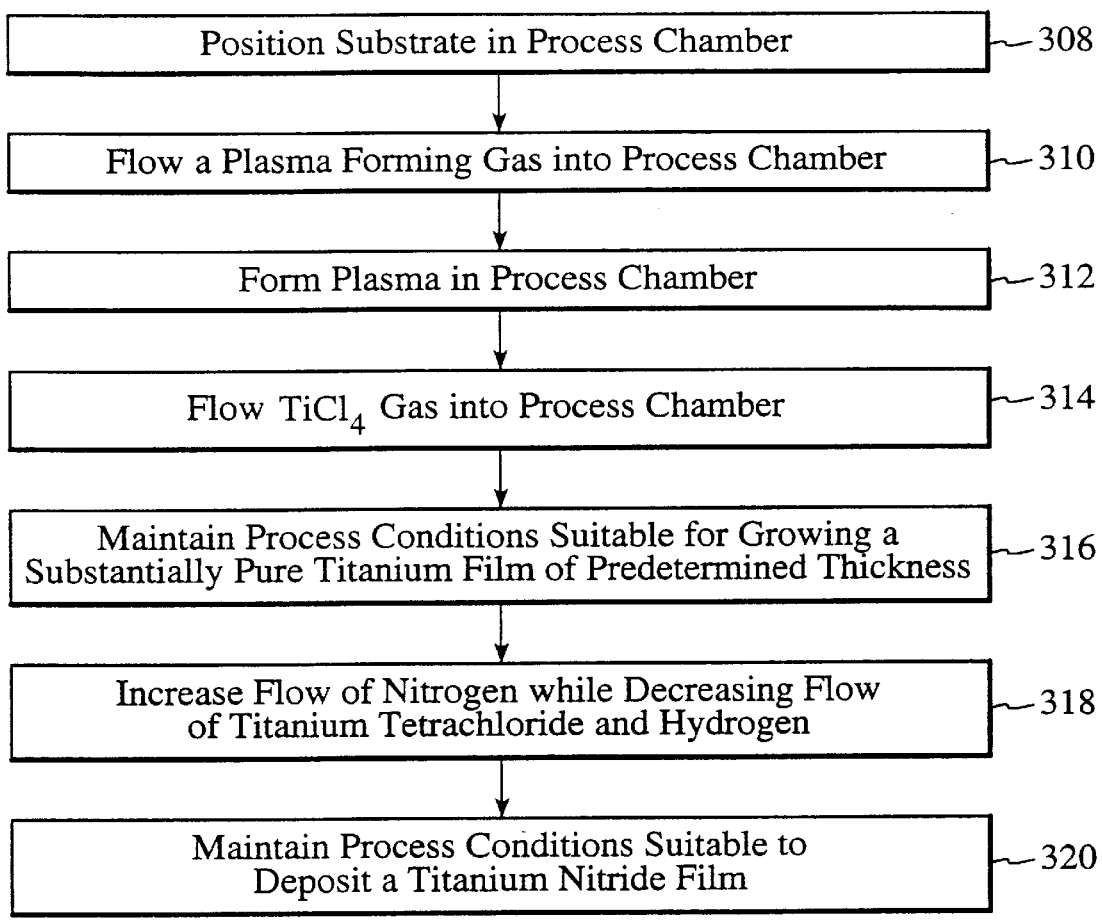
FIG. 8 is a flow diagram of the method shown in FIG. 5, in accord with an alternative embodiment.

Referring to FIG. 7, in an alternate embodiment, a portion of the flow of hydrogen gas follows, substantially, the contour of the interior surface of the dome 50, moving transversely to the direction of the flow of titanium tetrachloride. This may be achieved by providing the top vent 98 with a curved shape to have the flow of hydrogen gas 98a entering the process chamber obliquely with respect to the flow of titanium tetrachloride gas 96a. In this fashion, unwanted deposition of a titanium containing film within the process chamber is reduced Moreover, referring to FIGS. 1 and 6, the present invention may be employed to deposit a titanium nitride film, TiN. To that end, a gas source 100c of nitrogen, $N_2$, is included. Source nozzle MFC 102C controls the amount of nitrogen delivered to gas nozzles 106 and 108. Typically, the nitrogen content in the process chamber is gradually increased subsequent to the introduction of titanium tetrachloride gas therein. The method includes, therefore, steps 308, 310, 312 and 314 which are identical to steps 208, 210, 212 and 214, respectively and described above in FIG. 5. Step 316 of FIG. 8, however, includes maintaining process conditions suitable for growing a substantially pure titanium film of predetermined thickness. The aforementioned thickness is typically in the range of 50 to 400 Å. After the titanium film has reached the predetermined thickness, the flow of nitrogen into the process chamber 38 is slowly increased as the flow of titanium tetrachloride and hydrogen is decreased, at step 318. The nitrogen flow is increased to be in the range of 300 to 4,000 sccm, with the ratio of nitrogen to titanium tetrachloride being in the range of 20:1 to 1,000:1. The ratio of nitrogen to hydrogen is in the range of 0.5:1 to 5:1. Thereafter, at step 320, the process conditions are maintained at suitable conditions to deposit a titanium nitride film of desired thickness.

This process is advantageous for forming a stable contact due to reduced oxidation of the substantially pure titanium film. Titanium is an active metal and prone to oxidization when exposed to the ambient. By having the titanium nitride film formed in the same process chamber as the substantially pure titanium film, exposure to the ambient may be avoided. In this fashion, a more stable contact may be formed making a titanium nitride film which suitable to function as a barrier layer. The method may be varied to control both the deposition and etch rates as desired and to deposit other metal films, such as a tantalum containing film. To that end, the titanium tetrachloride, $TiCl_4$ described above may be replaced with either tantalumbromide, $TaBr_5$ or tantalumchloride, $TaCl_5$. The scope of the invention should, therefore, be determined not with reference to the above description, but instead should be determined with reference to the appended claims along with their full scope of equivalents.

What is claimed is:

1. A method for depositing a metal film on a substrate disposed in a process chamber, said method comprising:

flowing, into said process chamber, a deposition gas including a metal source gas including a metal from the group consisting of titanium or tantalum;

flowing, into said process chamber, a plasma forming gas, with said plasma forming gas being introduced into said process chamber separately from said deposition gas;

flowing an inert gas into said process chamber via an aperture centrally disposed in a dome shaped cover of said process chamber, said inert gas following a contour of said dome and being positioned between said dome and said flow of said deposition gas;

forming an inductively coupled plasma, with said inductively coupled plasma being present in said process chamber; and maintaining process conditions suitable for depositing a film containing metal on said substrate.

2. The method as recited in claim 1 wherein said titanium source includes $TiCl_4$.

3. The method as recited in claim 1 wherein said tantalum source includes $TaCl_5$.

4. The method as recited in claim 1 wherein said tantalum source includes $TaBr_5$.

5. The method as recited in claim 1 wherein said deposition gas further includes a nitrogen gas.

6. The method as recited in claim 1 wherein said film comprises of substantially pure titanium.

7. The method as recited in claim 1 wherein said film comprises of titaniumsilicide.

8. The method as recited in claim 1 wherein said inert gas comprises hydrogen.

9. The method as recited in claim 1 wherein said inert gas comprises hydrogen and nitrogen.

10. The method as recited in claim 1 wherein said film comprises of substantially pure titanium nitride.

11. A method for depositing a metal film on a substrate disposed in a process chamber, said method comprising:

flowing, into said process chamber, a deposition gas including a metal source gas including a metal from the group consisting of titanium or tantalum, wherein said deposition gas further includes a nitrogen gas;

flowing, into said process chamber, a plasma forming gas, with said plasma forming gas being introduced into said process chamber separately from said deposition gas;

forming an inductively coupled plasma, with said inductively coupled plasma being present in said process chamber; and maintaining process conditions suitable for depositing a film containing metal on said substrate;

wherein said process chamber includes a dome-shaped cover having an aperture centrally disposed therein with said substrate lying in a plane positioned opposite to said aperture, a flow of said metal source gas being directed substantially transversely to said plane and a portion of said flow of nitrogen substantially following a contour of said dome.

12. A method for depositing a metal film on a substrate disposed in a process chamber, said method comprising:

separately flowing, into said process chamber, a plasma forming gas and a deposition gas, with said deposition gas including a flow of $TiCl_4$ gas, wherein said process chamber includes a dome-shaped cover having an aperture centrally disposed therein with said substrate lying in a plane positioned opposite to said aperture, at least a portion of said flow of $TiCl_4$ gas being directed substantially transversely to said plane with a portion of said flow of plasma forming gas substantially following a contour of said dome;

forming a plasma, with said plasma being present in said processing chamber; and maintaining process conditions suitable for depositing a film containing titanium on said substrate.

13. The method as recited in claim 12 wherein said plasma forming gas includes a flow of hydrogen gas.

14. The method as recited in claim 12 wherein said film comprises of substantially pure titanium.

15. The method as recited in claim 12 wherein said deposition gas further includes a flow of nitrogen.

16. The method as recited in claim 15 wherein said film comprises of substantially pure titanium nitride.

* * * * *